US012597893B2

(12) United States Patent
 Nishikawa

(10) Patent No.: US 12,597,893 B2
(45) Date of Patent: Apr. 7, 2026

(54) SEMICONDUCTOR INTEGRATED CIRCUIT AND RADIO-FREQUENCY MODULE

(71) Applicant: Murata Manufacturing Co., Ltd., Kyoto (JP)

(72) Inventor: Hiroshi Nishikawa, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 600 days.

(21) Appl. No.: 18/166,132

(22) Filed: Feb. 8, 2023

(65) Prior Publication Data

US 2023/0188098 A1 Jun. 15, 2023

Related U.S. Application Data

(63) Continuation of application No. PCT/JP2021/032736, filed on Sep. 6, 2021.

(30) Foreign Application Priority Data

Sep. 25, 2020 (JP) ................................. 2020-161174

(51) Int. Cl.
 *H03F 3/195* (2006.01)
 *H03F 3/187* (2006.01)
 *H03F 3/217* (2006.01)
(52) U.S. Cl.
 CPC ........... *H03F 3/187* (2013.01); *H03F 3/2178* (2013.01)
(58) Field of Classification Search
 CPC .................................. H03F 3/195; H03F 1/02
 USPC ...................................... 330/307, 124 R, 295
 See application file for complete search history.

(56) References Cited

U.S. PATENT DOCUMENTS

| | | | | |
|---|---|---|---|---|
| 7,190,941 B2* | 3/2007 | Sorrells | .................... | H04B 1/30 |
| | | | | 455/524 |
| 7,348,856 B2* | 3/2008 | Shimizu | .................... | H03F 3/68 |
| | | | | 330/307 |
| 8,797,103 B2* | 8/2014 | Kaczman | .............. | H03F 1/0222 |
| | | | | 330/307 |
| 8,836,433 B2* | 9/2014 | Dening | .................... | H03F 3/195 |
| | | | | 330/307 |
| 10,009,054 B2* | 6/2018 | Wloczysiak | ............. | H04B 1/10 |
| 2005/0009484 A1 | 1/2005 | Imai et al. | | |
| 2015/0133067 A1 | 5/2015 | Chang et al. | | |
| 2017/0353211 A1 | 12/2017 | Roy et al. | | |
| 2019/0238169 A1 | 8/2019 | Naniwa et al. | | |

(Continued)

FOREIGN PATENT DOCUMENTS

| | | |
|---|---|---|
| JP | 2005-033350 A | 2/2005 |
| WO | 2018/088410 A1 | 5/2018 |

(Continued)

OTHER PUBLICATIONS

International Search Report for PCT/JP2021/032736 dated Nov. 22, 2021.

*Primary Examiner* — Henry Choe
(74) *Attorney, Agent, or Firm* — McDonald Hopkins LLC

(57) ABSTRACT

A semiconductor IC includes a first radio-frequency element (e.g., an inductor in a low-noise amplifier), a second radio-frequency element (e.g., an inductor in a low-noise amplifier), a first via conductor (e.g., a via conductor that is placed between the first radio-frequency element and the second radio-frequency element and that is connected to a ground potential.

16 Claims, 7 Drawing Sheets

(56) References Cited

U.S. PATENT DOCUMENTS

| 2021/0058040 | A1 | 2/2021 | Tabei et al. |
| 2021/0159133 | A1 | 5/2021 | Aikawa et al. |

FOREIGN PATENT DOCUMENTS

| WO | 2019/208371 | A1 | 10/2019 |
| WO | 2020/066380 | A1 | 4/2020 |

* cited by examiner

SEMICONDUCTOR INTEGRATED CIRCUIT AND RADIO-FREQUENCY MODULE

CROSS REFERENCE TO RELATED APPLICATION

This is a continuation of International Application No. PCT/JP2021/032736 filed on Sep. 6, 2021 which claims priority from Japanese Patent Application No. 2020-161174 filed on Sep. 25, 2020. The contents of these applications are incorporated herein by reference in their entireties.

BACKGROUND ART

Technical Field

The present disclosure relates to a semiconductor integrated circuit and a radio-frequency module.

In mobile communication devices such as mobile phones, the number of circuit components forming a radio-frequency front-end module increases with, in particular, the development of multi-band communication. For example, Patent Document 1 discloses a front-end module in which a plurality of low-noise amplifiers are packaged.

Patent Document 1: U.S. Patent Application Publication No. 2015/0133067

BRIEF SUMMARY

In such a front-end module in the related art, a plurality of radio-frequency elements or a plurality of electric circuits are integrated in a semiconductor integrated circuit in some cases for downsizing. In such a case, inductive coupling and/or capacitive coupling may occur between these multiple radio-frequency elements or these multiple electric circuits and the electric characteristics of the front-end module may be deteriorated.

The present disclosure provides a semiconductor integrated circuit and a radio-frequency module with which the inductive coupling and/or capacitive coupling between a plurality of radio-frequency elements or a plurality of electric circuits integrated in the semiconductor integrated circuit can be suppressed.

A semiconductor integrated circuit according to an aspect of the present disclosure includes a first radio-frequency element, a second radio-frequency element, and a first via conductor that is placed between the first radio-frequency element and the second radio-frequency element and that is connected to a ground potential.

With a semiconductor integrated circuit according to an aspect of the present disclosure, the inductive coupling and/or capacitive coupling between a plurality of radio-frequency elements or a plurality of electric circuits integrated in the semiconductor integrated circuit can be suppressed.

DETAILED DESCRIPTION

Figure 1:
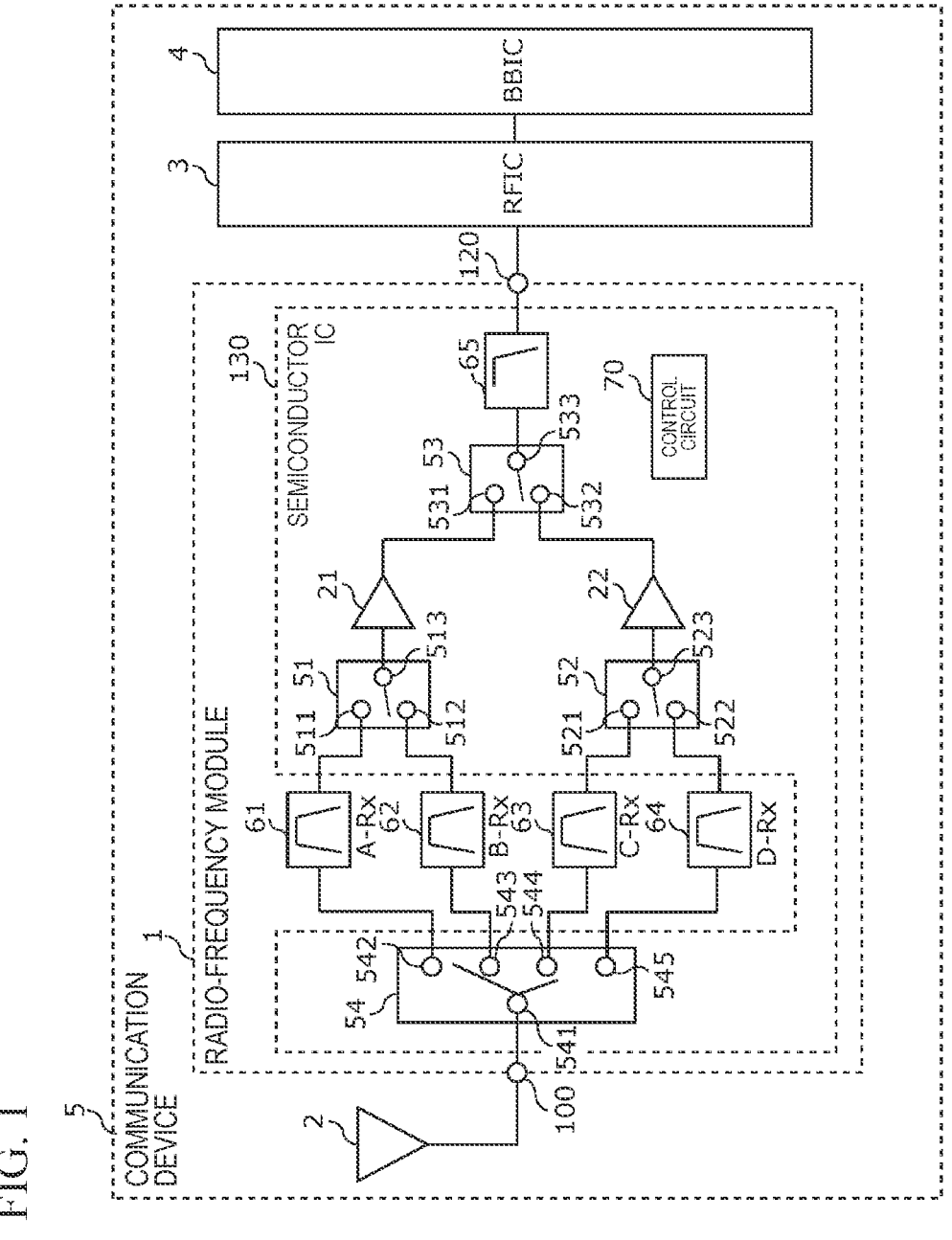
FIG. 1 is a diagram illustrating the circuit configuration of a radio-frequency module and a communication device according to an embodiment.

An embodiment of the present disclosure will be described in detail below with reference to the drawings. It should be noted that the embodiment to be described below is a comprehensive or concrete example. The numerical values, shapes, materials, constituent elements, arrangement of the constituent elements, coupling forms, and the like to be described in the following embodiment are merely examples, and are not intended to limit the present disclosure.

The drawings are schematically illustrated with appropriate accentuation, omission, or proportion adjustment to depict the present disclosure and are not necessarily illustrated in an exact manner, and the shape, positional relationship, and proportion may be different from actual ones. Same reference symbols are used to denote substantially same configurations in the drawings, and redundant descriptions thereof may be omitted or simplified.

In the drawings to be described below, the X axis and the Y axis are axes perpendicular to each other in a plane parallel to main surfaces of a module substrate. The Z axis is perpendicular to the main surfaces of the module substrate, the forward direction of the Z axis indicates the upward direction, and the reverse direction of the Z axis indicates the downward direction.

Regarding the circuit configuration of the present disclosure, the expression "coupled" includes not only the case in which a circuit element is directly coupled to another circuit element by using a connection terminal and/or a wiring conductor but also the case in which a circuit element is electrically coupled to another circuit element via still another circuit element. The expression "directly coupled" denotes that a circuit element is directly coupled to another circuit element by using a connection terminal and/or a wiring conductor without necessarily intermediate connection with still another circuit element. The expression "is coupled between A and B" denotes that the subject is positioned between A and B and coupled to both A and B.

Regarding the component arrangement of the present disclosure, the expression "plan view" denotes that an object orthogonally projected on an xy plane is viewed from the positive side of the Z axis. The expression "A overlaps B when viewed in plan view" denotes that at least a part of the area of A orthogonally projected on the xy plane overlaps at least a part of the area of B orthogonally projected on the xy plane. The expression "a component is disposed on the main surface of a substrate" includes the case in which the component is placed on the main surface of the substrate in a state of being in contact with the main surface, the case in which the component is placed over the main surface without necessarily being in contact with the main surface (for example, the component is stacked on a component placed on the substrate), and the case in which the component is partially embedded in the substrate from the main surface side. The expression "A is placed between B and C" denotes that at least one of line segments each connecting a point of B and a point of C passes A.

Embodiment

[1.1 Circuit Configuration of Radio-frequency Module 1 and Communication Device 5]

The circuit configuration of a radio-frequency module 1 and a communication device 5 according to the present embodiment will be described with reference to FIG. 1. FIG. 1 is a diagram illustrating the circuit configuration of the radio-frequency module 1 and the communication device 5 according to an embodiment.

[1.1.1 Circuit Configuration of Communication Device 5]

First, the circuit configuration of the communication device 5 will be described. As illustrated in FIG. 1, the communication device 5 according to present embodiment includes the radio-frequency module 1, an antenna 2, an RFIC 3, and a BBIC 4.

The radio-frequency module 1 transmits a radio-frequency signal between the antenna 2 and the RFIC 3. The internal configuration of the radio-frequency module 1 will be described below.

The antenna 2 is connected to an antenna connection terminal 100 of the radio-frequency module 1. The antenna 2 externally receives a radio-frequency signal and outputs the radio-frequency signal to the radio-frequency module 1.

The RFIC 3 is an example of a signal processing circuit for processing a radio-frequency signal. Specifically, the RFIC 3 performs signal processing such as down conversion upon a radio-frequency reception signal input via a reception path in the radio-frequency module 1 and outputs a reception signal generated as a result of the signal processing to the BBIC 4. The RFIC 3 includes a control unit for controlling, for example, a switch and an amplifier included in the radio-frequency module 1. The function of the controller of the RFIC 3 may be partially or entirely implemented outside the RFIC 3 and may be implemented in, for example, the BBIC 4 or the radio-frequency module 1.

The BBIC 4 is a baseband signal processing circuit for performing signal processing using an intermediate frequency range lower than the frequency of a radio-frequency signal transmitted by the radio-frequency module 1. Examples of a signal processed by the BBIC 4 include an image signal for image display and/or an audio signal for conversation through a speaker.

In the communication device 5 according to the present embodiment, the antenna 2 and the BBIC 4 are optional constituent elements.

[1.1.2 Circuit Configuration of Radio-frequency Module 1]

Next, the circuit configuration of the radio-frequency module 1 will be described. As illustrated in FIG. 1, the radio-frequency module 1 includes low-noise amplifiers 21 and 22, switches 51 to 54, filters 61 to 65, a control circuit 70, an antenna connection terminal 100, and a radio-frequency output terminal 120. The low-noise amplifiers 21 and 22, the switches 51 to 54, the filter 65, and the control circuit 70 are included in a semiconductor integrated circuit (IC) 130.

The antenna connection terminal 100 is connected to the antenna 2.

The switch 54 is connected between the antenna connection terminal 100 and the filters 61 to 64. The switch 54 has terminals 541 to 545. The terminal 541 is connected to the antenna connection terminal 100. The terminals 542 to 545 are connected to the filters 61 to 64, respectively.

In this connection configuration, the switch 54 is capable of connecting at least one of the terminal 542, 543, 544, or 545 to the terminal 541, for example, in accordance with a control signal from the RFIC 3. That is, the switch 54 is capable of switching between connection and non-connection between the antenna connection terminal 100 and each of the filters 61 to 64. The switch 54 is formed of, for example, a multi-connection-type switch circuit and is sometimes called an antenna switch.

In the following description, a communication band means a frequency band defined in advance for a communication system by standards bodies or the likes (e.g., 3GPP (the 3rd Generation Partnership Project) and IEEE (the Institute of Electrical and Electronics Engineers)). A communication system means a communication system that is built using a radio access technology (RAT). Although, for example, a 5G NR (5th Generation New Radio) system, an LTE (Long Term Evolution) system, or a WLAN (Wireless Local Area Network) system may be used as the communication system, the communication system is not limited thereto.

The filter 61 (A-Rx) is an example of a first filter and has a passband including at least a part of a communication band A. The communication band A is an example of a first communication band. When the communication band A is a communication band for Frequency Division Duplex (FDD), the passband of the filter 61 includes a downlink operating band of the communication band A. The downlink operating band means a part of a communication band specified for a downlink. When the communication band A is a communication band for Time Division Duplex (TDD), the passband of the filter 61 includes the whole of the communication band A. One end of the filter 61 is connected to the antenna connection terminal 100 via the switch 54. The other end of the filter 61 is connected to the input of the low-noise amplifier 21 via the switch 51.

The filter (B-Rx) 62 is an example of a second filter and has a passband including at least a part of a communication band B. The communication band B is an example of a second communication band. When the communication band B is a communication band for FDD, the passband of the filter 62 includes the downlink operating band of the communication band B. When the communication band B is a communication band for TDD, the passband of the filter 62 includes the whole of the communication band B. One end of the filter 62 is connected to the antenna connection terminal 100 via the switch 54. The other end of the filter 62 is connected to the input of the low-noise amplifier 21 via the switch 51.

The filter 63 (C-Rx) is an example of a third filter and has a passband including at least a part of a communication band C. The communication band C is an example of a third communication band. When the communication band C is a communication band for FDD, the passband of the filter 63 includes the downlink operating band of the communication band C. When the communication band C is a communication band for TDD, the passband of the filter 63 includes the whole of the communication band C. One end of the filter 63 is connected to the antenna connection terminal 100 via the switch 54. The other end of the filter 63 is connected to the input of the low-noise amplifier 22 via the switch 52.

The filter 64 (D-Rx) is an example of a fourth filter and has a passband including at least a part of a communication band D. The communication band D is an example of a fourth communication band. When the communication band D is a communication band for FDD, the passband of the filter 64 includes the downlink operating band of the communication band D. When the communication band D is a communication band for TDD, the passband of the filter 64 includes the whole of the communication band D. One end of the filter 64 is connected to the antenna connection terminal 100 via the switch 54. The other end of the filter 64 is connected to the input of the low-noise amplifier 22 via the switch 52.

The switch 51 is an example of a first switch and is connected between the filters 61 and 62 and the low-noise amplifier 21. The switch 51 has terminals 511 to 513. The terminals 511 and 512 are connected to the filters 61 and 62, respectively. The terminal 513 is connected to the input of the low-noise amplifier 21.

In this connection configuration, the switch 51 is capable of connecting at least one of the terminal 511 or 512 to the terminal 513, for example, in accordance with a control signal from the RFIC 3. That is, the switch 51 is capable of individually switching between the connection and non-connection between the filter 61 and the low-noise amplifier 21 and the connection and non-connection between the filter 62 and the low-noise amplifier 21. The switch 51 is formed of, for example, a multi-connection-type switch circuit.

The switch 52 is an example of a second switch and is connected between the filters 63 and 64 and the low-noise amplifier 22. The switch 52 has terminals 521 to 523. The terminals 521 and 522 are connected to the filters 63 and 64, respectively. The terminal 523 is connected to the input of the low-noise amplifier 22.

In this connection configuration, the switch 52 is capable of connecting at least one of the terminal 521 or 522 to the terminal 523, for example, in accordance with a control signal from the RFIC 3. That is, the switch 52 is capable of individually switching between the connection and non-connection between the filter 63 and the low-noise amplifier 22 and the connection and non-connection between the filter 64 and the low-noise amplifier 22. The switch 52 is formed of for example, a multi-connection-type switch circuit.

The low-noise amplifier 21 is an example of a first low-noise amplifier. The input of the low-noise amplifier 21 is connected to the filters 61 and 62 via the switch 51, and the output of the low-noise amplifier 21 is connected to the filter 65 via the switch 53.

The low-noise amplifier 22 is an example of a second low-noise amplifier. The input of the low-noise amplifier 22 is connected to the filters 63 and 64 via the switch 52, and the output of the low-noise amplifier 22 is connected to the filter 65 via the switch 53.

The circuit configurations of the low-noise amplifiers 21 and 22 will be described below with reference to FIG. 2.

The switch 53 is an example of a third switch and is connected between the low-noise amplifiers 21 and 22 and the filter 65. The switch 53 has terminals 531 to 533. The terminals 531 and 532 are connected to the outputs of the low-noise amplifiers 21 and 22, respectively. The terminal 533 is connected to one end of the filter 65.

In this connection configuration, the switch 53 is capable of connecting at least one of the terminal 531 or 532 to the terminal 533, for example, in accordance with a control signal from the RFIC 3. That is, the switch 53 is capable of individually switching between the connection and non-connection between the low-noise amplifier 21 and the filter 65 and the connection and non-connection between the low-noise amplifier 22 and the filter 65. The switch 53 is formed of, for example, a multi-connection-type switch circuit.

The filter 65 is an example of a fifth filter and has a passband including at least a part of each of the communication bands A to D. One end of the filter 65 is connected to the terminal 533 of the switch 53, and the other end of the filter 65 is connected to the radio-frequency output terminal 120. Although, for example, a low pass filter formed of an LC circuit may be used as the filter 65, the filter 65 is not limited thereto. The circuit configuration of the filter 65 will be described below with reference to FIG. 3.

The control circuit 70 is an electric circuit for a control signal of a frequency lower than that of a radio-frequency signal. The control circuit 70 receives a digital control signal, such as an MIPI (Mobile Industry Processor Interface) signal and/or a GPIO (General Purpose I/O) signal, from, for example, the RFIC 3 and controls at least one of the low-noise amplifier 21, the low-noise amplifier 22, the switch 51, the switch 52, the switch 53, or the switch 54.

The semiconductor IC 130 includes a plurality of radio-frequency circuits and the control circuit 70. In the present embodiment, the semiconductor IC 130 includes the switches 51 to 54, the low-noise amplifiers 21 and 22, and the filter 65 as a plurality of radio-frequency circuits.

Some of the circuit elements illustrated in FIG. 1 do not necessarily have to be included in the radio-frequency module 1. For example, the radio-frequency module 1 does not necessarily have to include circuit elements (e.g., the switch 51 and the filters 61 to 64) other than the semiconductor IC 130 including a plurality of radio-frequency elements.

[1.1.3 Circuit Configuration of Low-noise Amplifier 21 and 22]

Next, the circuit configuration of the low-noise amplifier 21 will be described with reference to FIG. 2. FIG. 2 is a diagram illustrating the circuit configuration of the low-noise amplifier 21 included in the radio-frequency module 1 according to an embodiment. The low-noise amplifier 22 has the same circuit configuration as the low-noise amplifier 21, and the illustration and description thereof will be omitted.

Figure 2:
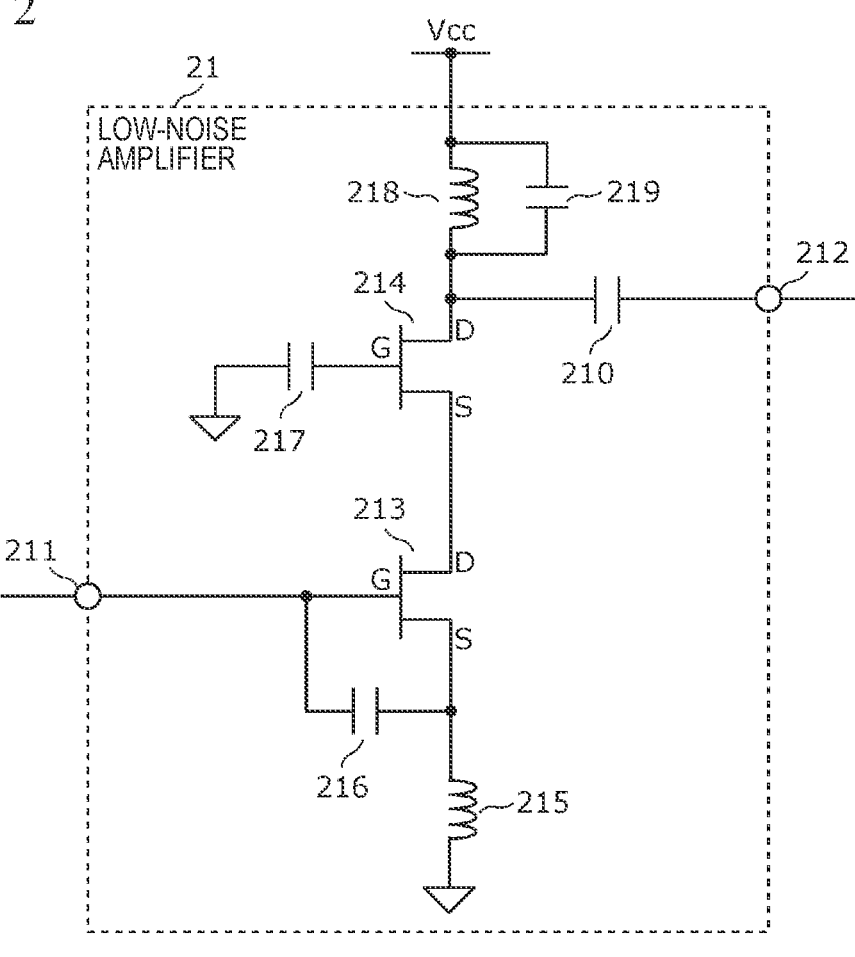
FIG. 2 is a diagram illustrating the circuit configuration of a low-noise amplifier included in a radio-frequency module according to an embodiment.

As illustrated in FIG. 2, the low-noise amplifier 21 includes an input terminal 211, an output terminal 212, field effect transistors (FETs) 213 and 214 that are cascode-connected, inductors 215 and 218, and capacitors 216, 217, 219, and 210.

The input terminal 211 is connected to the terminal 513 of the switch 51 and receives a reception signal in the communication band A and a reception signal in the communication band B from the filters 61 and 62, respectively via the switch 51.

The output terminal 212 is connected to the terminal 531 of the switch 53 and outputs amplified reception signals in the communication bands A and B to the radio-frequency output terminal 120 via the switch 53 and the filter 65.

The source terminal of the FET 213 is connected to the other end of the inductor 215, one end of which is connected to the ground. The gate terminal of the FET 213 is connected to the input terminal 211. The capacitor 216 is connected between the gate and source of the FET 213.

The inductor 215 is an example of a second radio-frequency element and corresponds to a second inductor. The inductor 215 functions as a source inductor to form a series feedback.

The source terminal of the FET 214 is connected to the drain terminal of the FET 213. The gate terminal of the FET 214 is connected to the ground via the capacitor 217. The drain terminal of the FET 214 is connected to the output terminal 212 via the capacitor 210. The drain terminal of the FET 214 is also connected to a power supply line for supplying a power-supply voltage via the inductor 218 and the capacitor 219 that are connected in parallel.

The inductor 218 is an example of a first radio-frequency element and corresponds to a first inductor. The inductor 218 functions as a choke inductor for suppressing the flow of a radio-frequency signal from a radio-frequency signal line for transmitting a radio-frequency signal into a power supply line for supplying a power-supply voltage. The inductor 218 also functions as an impedance matching circuit for output impedance matching along with the capacitors 219 and 210.

The circuit configuration of the low-noise amplifier 21 illustrated in FIG. 2 is an example, and the circuit configuration of the low-noise amplifier 21 is not limited thereto. For example, instead of the FETs, heterojunction bipolar transistors (HBTs) may be used.

[1.1.4 Circuit Configuration of Filter 65]

Figure 3:
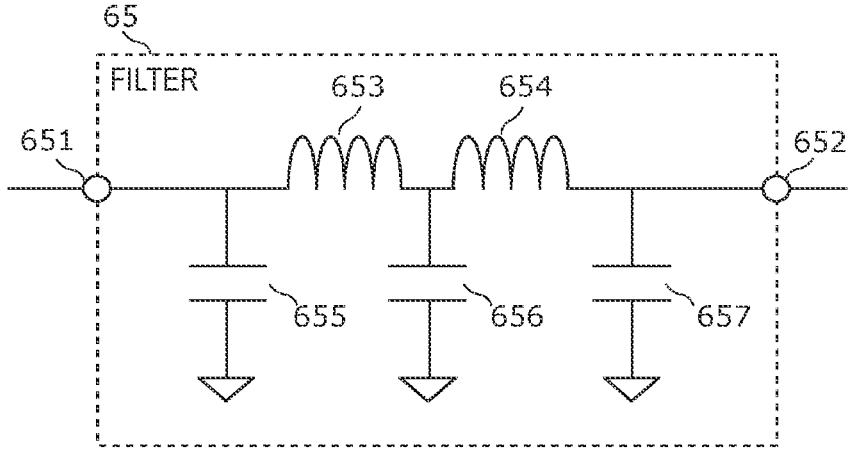
FIG. 3 is a diagram illustrating the circuit configuration of a filter included in a radio-frequency module according to an embodiment.

Next, the circuit configuration of the filter 65 will be described with reference to FIG. 3. FIG. 3 is a diagram illustrating the circuit configuration of the filter 65 included in the radio-frequency module 1 according to an embodiment.

The filter 65 is an LC filter and functions as a low pass filter. As illustrated in FIG. 3, the filter 65 includes an input terminal 651, an output terminal 652, inductors 653 and 654, and capacitors 655 to 657. The filter 65 is not limited to a low pass filter. The filter 65 may function as a high pass filter, a bandpass filter, or a band elimination filter and may function as an impedance matching element.

The input terminal 651 is connected to the terminal 533 of the switch 53 and receives amplified reception signals from the low-noise amplifiers 21 and 22 via the switch 53.

The output terminal 652 is connected to the radio-frequency output terminal 120 and outputs reception signals in the communication bands A to D output from the filter 65 to the radio-frequency output terminal 120.

The inductor 653 is an example of a third inductor. One end of the inductor 653 is connected to the input terminal 651 and is also connected to the ground via the capacitor 655. The other end of the inductor 653 is connected to one end of the inductor 654 and is also connected to the ground via the capacitor 656.

The inductor 654 is also an example of the third inductor. One end of the inductor 654 is connected to the other end of the inductor 653 and is also connected to the ground via the capacitor 656. The other end of the inductor 654 is connected to the output terminal 652 and is also connected to the ground via the capacitor 657.

The circuit configuration of the filter 65 illustrated in FIG. 3 is an example, and the circuit configuration of the filter 65 is not limited thereto. For example, the filter 65 does not necessarily have to include the inductor 653 and the capacitor 655. In this case, one end of the inductor 654 may be connected to the input terminal 651.

[1.2 Arrangement of Components in Radio-frequency Module 1]

Next, the arrangement of components in the radio-frequency module 1 having the above configuration will be described in detail with reference to FIGS. 4 to 8.

Figures 4A, 4B:
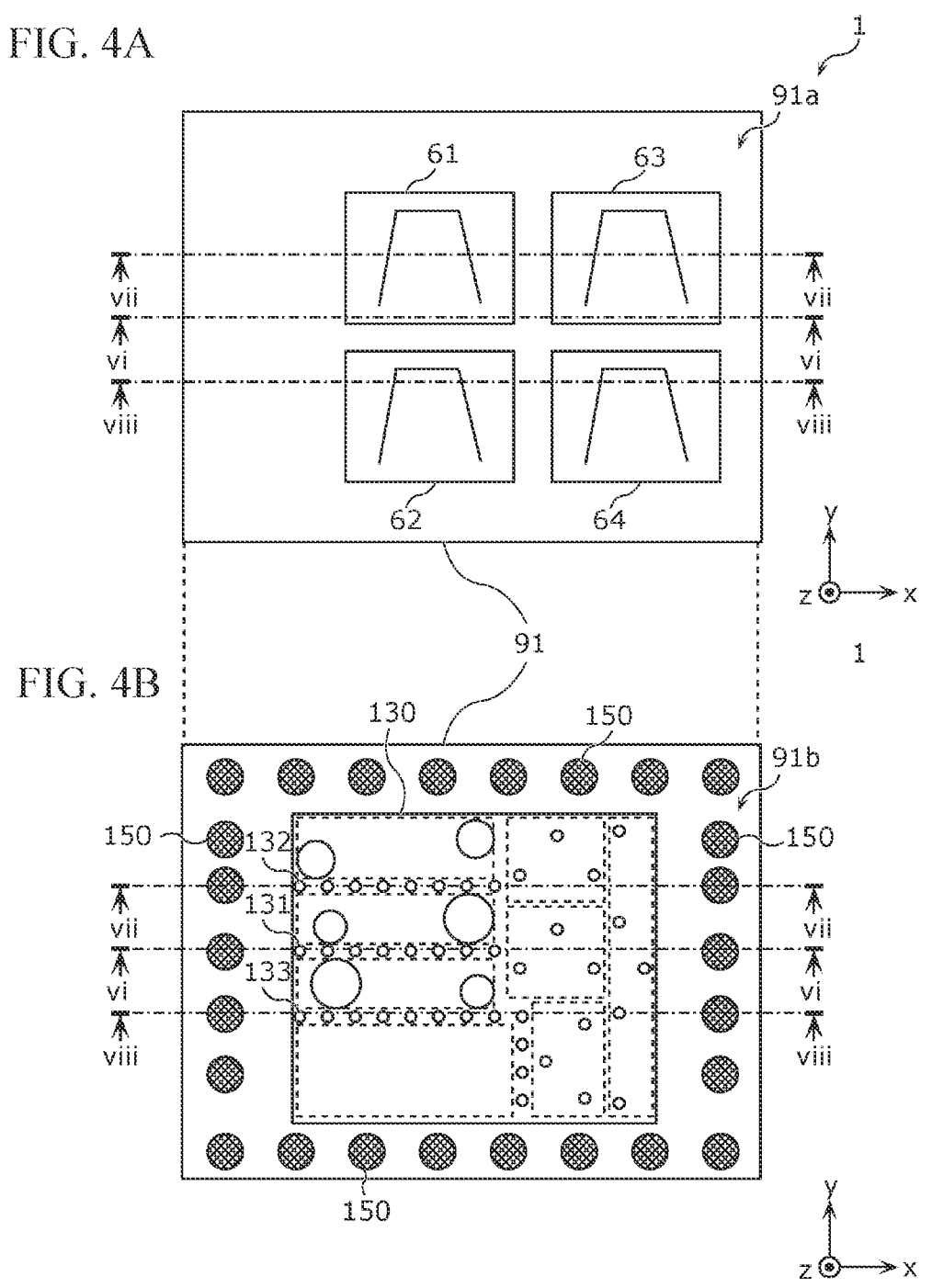
FIGS. 4A and 4B are plan views of a radio-frequency module according to an embodiment.

FIGS. 4A and 4B are plan views of the radio-frequency module 1 according to an embodiment.

Figure 5:
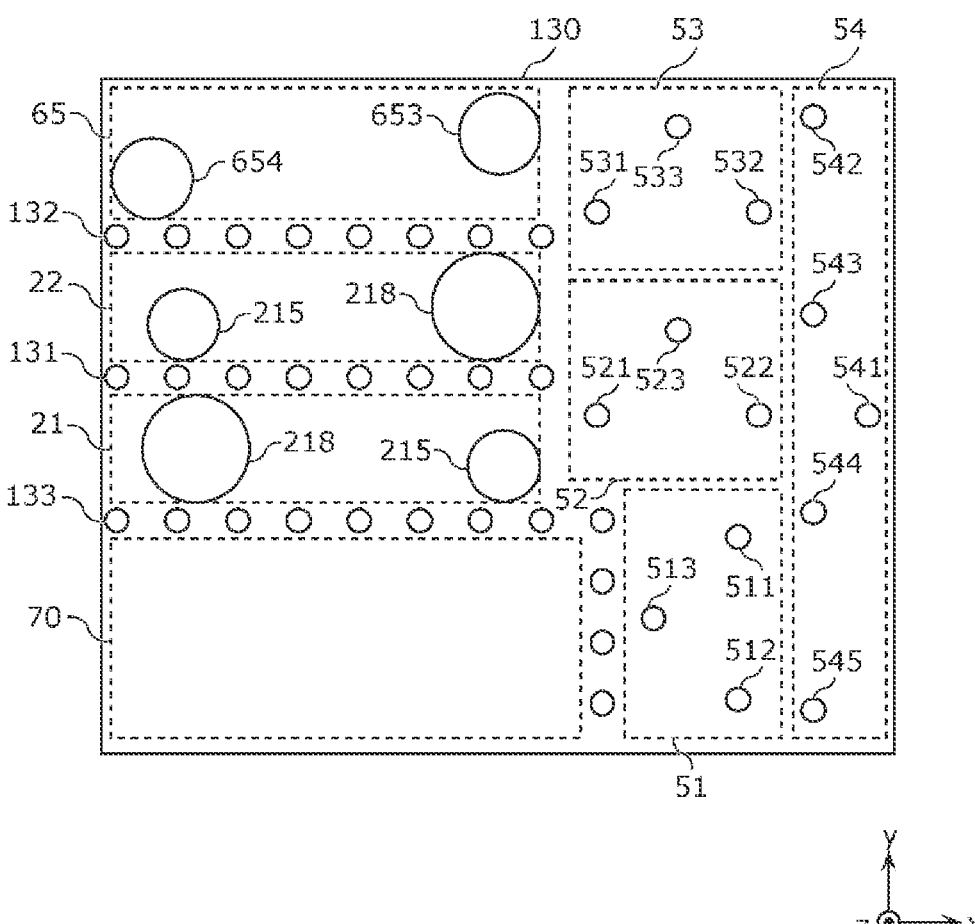
FIG. 5 is an enlarged plan view of a semiconductor IC included in a radio-frequency module according to an embodiment.
Figure 6:
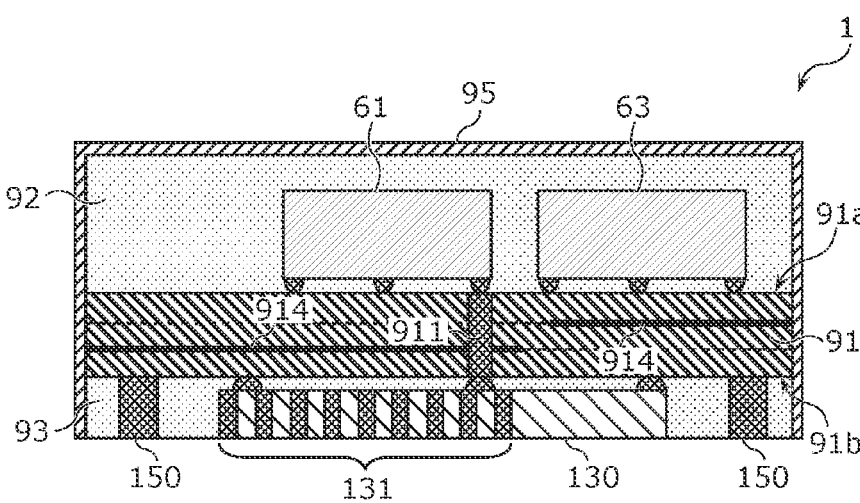
FIG. 6 is a sectional view of a radio-frequency module according to an embodiment.
Figure 6:
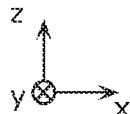
Figure 7:
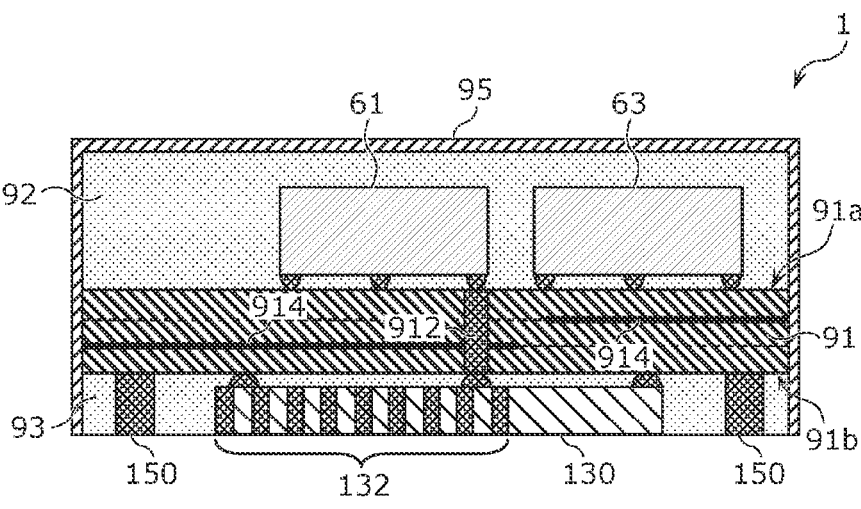
FIG. 7 is a sectional view of a radio-frequency module according to an embodiment.
Figure 7:
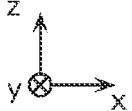
Figure 8:
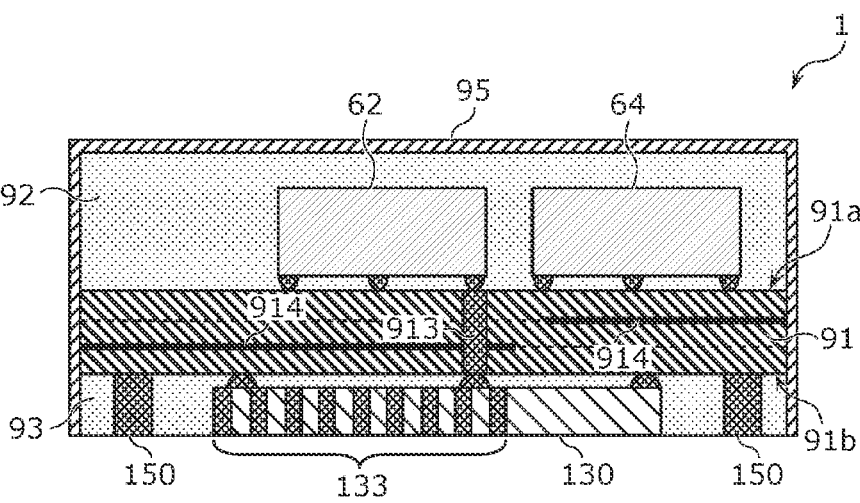
FIG. 8 is a sectional view of a radio-frequency module according to an embodiment.
Figure 8:
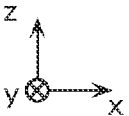

Specifically, FIG. 4A is a diagram illustrating a main surface 91a of a module substrate 91 viewed from the positive side of the z axis. FIG. 4B is a diagram illustrating a main surface 91b of the module substrate 91 viewed from the positive side of the z axis. FIG. 5 is an enlarged plan view of the semiconductor IC 130 included in the radio-frequency module 1 according to an embodiment. FIGS. 6 to 8 are sectional views of the radio-frequency module 1 according to an embodiment. The sections of the radio-frequency module 1 in FIGS. 6 to 8 are sections taken along the vi-vi line, the vii-vii line, and the viii-viii line in FIGS. 4A and 4B, respectively.

As illustrated in FIGS. 4A to 8, the radio-frequency module 1 further includes the module substrate 91, resin members 92 and 93, a shield electrode layer 95, and a plurality of post electrodes 150 in addition to the components including the circuit elements illustrated in FIG. 1. In FIGS. 4A and 4B, the illustration of the resin members 92 and 93 and the shield electrode layer 95 is omitted.

The module substrate 91 has the main surfaces 91a and 91b facing each other. Although the module substrate 91 is rectangular in shape in plan view in the present embodiment, the shape of the module substrate 91 in plan view is not limited thereto. Although, for example, a low temperature co-fired ceramic (LTCC) substrate having a laminated structure of a plurality of dielectric layers, a high temperature co-fired ceramic (HTCC) substrate, a component built-in substrate, a substrate including a redistribution layer (RDL), or a printed circuit board may be used as the module substrate 91, the module substrate 91 is not limited thereto. In the module substrate 91, via conductors 911 to 913 and a ground electrode pattern 914 are formed.

The via conductors 911 to 913 are through vias passing through the module substrate 91 in the thickness direction (z direction). The via conductors 911 to 913 are not limited to through vias. For example, each of the via conductors 911 to 913 may be formed of a blind vie formed on the main surface 91a side, a blind via formed on the main surface 91b side, and a planar electrode pattern connecting these two blind vias in the module substrate 91.

The main surface 91a is an example of a first main surface and is called a top face or a surface in some cases. On the main surface 91a, a plurality of components (specifically, the filters 61 to 64) are placed.

The filters 61 to 64 are acoustic wave filters (e.g., surface acoustic wave filters and/or acoustic wave filters using BAWs (bulk acoustic waves)). The filters 61 to 64 are not limited to acoustic wave filters and may be, for example, LC resonant filters and/or dielectric filters.

The resin member 92 is placed on the main surface 91a of the module substrate 91 and covers the main surface 91a and components on the main surfaces 91a. The resin member 92 has a function of ensuring the reliabilities, such as the mechanical strength and the moisture resistance, of the components on the main surface 91a.

The main surface 91b is an example of a second main surface and is called a bottom face or a rear face in some cases. The semiconductor IC 130 and the multiple post electrodes 150 are placed on the main surface 91b.

The semiconductor IC 130 is an electronic component including an electronic circuit (e.g., a radio-frequency circuit and/or a control circuit) formed on the surface of and in a semiconductor chip (also called a die). The semiconductor IC 130 may be formed of, for example, a CMOS (complementary metal oxide semiconductor) and, specifically, may be formed through an SOI (silicon on insulator) process. Accordingly, the semiconductor IC 130 can be manufactured at a low cost. The semiconductor IC 130 may be made of at least one of GaAs, SiGe, or GaN. As a result, a high-quality semiconductor component can be provided.

As illustrated in FIG. 5, in the semiconductor IC 130, a plurality of radio-frequency circuits (the switches 51 to 54, the low-noise amplifiers 21 and 22, and the filter 65) and the control circuit 70 are integrated and a plurality of via conductors 131 to 133 are further formed.

The multiple via conductors 131 are examples of a plurality of first via conductors. The multiple via conductors 131 are placed between the low-noise amplifiers 21 and 22 and are connected to the ground potential.

As illustrated in FIG. 5, the multiple via conductors 131 are arranged along the boundary between the low-noise amplifiers 21 and 22 and are used for the division between the low-noise amplifiers 21 and 22. At least one of the multiple via conductors 131 is placed between the inductor 215 included in the low-noise amplifier 21 and the inductor 218 included in the low-noise amplifier 22. At least one of the multiple via conductors 131 is placed between the inductor 218 included in the low-noise amplifier 21 and the inductor 215 included in the low-noise amplifier 22.

As illustrated in FIGS. 4 and 6, at least one of the multiple via conductors 131 overlaps the filter 61 in plan view and is connected to the filter 61 via the via conductor 911 in the module substrate 91.

The multiple via conductors 132 are examples of a plurality of second via conductors. The multiple via conductors 132 are placed between the low-noise amplifier 22 and the filter 65 and are connected to the ground potential.

As illustrated in FIG. 5, the multiple via conductors 132 are arranged along the boundary between the low-noise amplifier 22 and the filter 65 and are used for the division between the low-noise amplifier 22 and the filter 65. At least one of the multiple via conductors 132 is placed between the inductor 215 included in the low-noise amplifier 22 and the inductor 654 included in the filter 65. At least one of the multiple via conductors 132 is placed between the inductor 218 included in the low-noise amplifier 22 and the inductor 653 included in the filter 65.

As illustrated in FIGS. 4 and 7, at least one of the multiple via conductors 132 overlaps the filter 61 in plan view and is connected to the filter 61 via the via conductor 912 in the module substrate 91.

The multiple via conductors 133 are examples of a plurality of third via conductors. The multiple via conductors 133 are placed between the control circuit 70 and each of the low-noise amplifier 21 and the switch 51 and are connected to the ground potential.

As illustrated in FIG. 5, the multiple via conductors 133 are arranged along the boundary of the control circuit 70 and are used for the division between the control circuit 70 and each of the low-noise amplifier 21 and the switch 51.

As illustrated in FIGS. 4 and 8, at least one of the multiple via conductors 133 overlaps the filter 62 in plan view and is connected to the filter 62 via the via conductor 913 in the module substrate 91.

Each of the multiple via conductors 131 to 133 is a through via passing through the semiconductor IC 130 in the thickness direction (z direction) and is called a through silicon via (TSV). Each of the multiple via conductors 131 to 133 is not limited to a TSV. For example, each of the multiple via conductors 131 to 133 may be formed of a blind via formed on one surface of the semiconductor IC 130, a blind via formed on the other surface of the semiconductor IC 130, and a planar electrode pattern connecting these two blind vias in the semiconductor IC 130.

The multiple post electrodes 150 are examples of a plurality of external connection terminals including the antenna connection terminal 100 and the radio-frequency output terminal 120 illustrated in FIG. 1. Each of the multiple post electrodes 150 is placed on the main surface 91b of the module substrate 91 and extends from the main surface 91b along the z axis. Each of the multiple post electrodes 150 passes through the resin member 93, and one end thereof is exposed from the resin member 93. One end of each of the multiple post electrodes 150 which is exposed from the resin member 93 is connected to, for example, an input/output terminal and/or a ground electrode on a mother board placed on the negative direction side of the z axis of the radio-frequency module 1.

The resin member 93 is placed on the main surface 91b of the module substrate 91 and covers the main surface 91b and components on the main surface 91b. The resin member 93 has a function of ensuring the reliabilities, such as the mechanical strength and the moisture resistance, of the components on the main surface 91b. The lower surface of the resin member 93 is made flat, for example, by shaving the lower surface of the radio-frequency module 1, and the semiconductor IC 130 and the multiple post electrodes 150 are exposed from the lower surface of the resin member 93.

The shield electrode layer 95 is a metal thin film formed, for example, by spattering and covers the upper and side surfaces of the resin member 92, the side surfaces of the module substrate 91, and the side surfaces of the resin member 93. The shield electrode layer 95 is set at the ground potential and suppresses the entry of exogenous noise into the circuit components included in the radio-frequency module 1.

The configurations of the radio-frequency module 1 and the semiconductor IC 130 illustrated in FIGS. 4 to 8 are examples, and the configurations of the radio-frequency module 1 and the semiconductor IC 130 are not limited thereto.

For example, the semiconductor IC 130 does not necessarily have to include circuit elements other than at least two radio-frequency elements and at least one via conductor placed between the at least two radio-frequency elements. In this case, each of the at least two radio-frequency elements is not limited to an inductor and may be, for example, a capacitor.

The semiconductor IC 130 may include, for example, a radio-frequency circuit, the control circuit 70, and the at least one via conductor 133 placed between the radio-frequency circuit and the control circuit 70. In this case, the radio-frequency circuit may be any of, but is not limited to, the low-noise amplifiers 21 and 22, the filter 65, and the switches 51 to 53.

[1.3 Effects, Etc.]

As described above, the semiconductor IC 130 according to the present embodiment includes a first radio-frequency element (e.g., the inductor 218 in the low-noise amplifier 21), a second radio-frequency element (e.g., the inductor 215 in the low-noise amplifier 22), and a first via conductor (e.g., the via conductor 131) that is placed between the first radio-frequency element and the second radio-frequency element and that is connected to a ground potential.

With this configuration, the first via conductor connected to the ground potential can be placed between the first radio-frequency element and the second radio-frequency element. Accordingly, the inductive coupling and/or capacitive coupling between the first radio-frequency element and the second radio-frequency element can be suppressed in the semiconductor IC 130. As a result, the electric characteristics of respective radio-frequency paths to which the first radio-frequency element and the second radio-frequency element are connected can be improved.

For example, in the semiconductor IC 130 according to the present embodiment, the first via conductor may be a through via passing through the semiconductor IC 130 in a thickness direction of the semiconductor IC 130.

With this configuration, the first via conductor can be formed of a through via. Accordingly, the first via conductor extending through the entire thickness can be provided between the first radio-frequency element and the second radio-frequency element, the coupling between the first radio-frequency element and the second radio-frequency element can be further suppressed.

In the semiconductor IC 130 according to the present embodiment, for example, the first radio-frequency element may be a first inductor and the second radio-frequency element may be a second inductor.

With this configuration, the first via conductor can be placed between the first inductor and the second inductor. In general, coupling (in particular, inductive coupling) more easily occurs between inductors as compared with between radio-frequency elements other than inductors. Accordingly, the coupling between the first inductor and the second inductor can be effectively suppressed by using the first via conductor, and the electric characteristics of respective radio-frequency paths to which the first inductor and the second inductor are connected can be more effectively improved.

For example, the semiconductor IC 130 according to the present embodiment may further include the low-noise amplifiers 21 and 22. The first inductor may be included in the low-noise amplifier 21, and the second inductor may be included in the low-noise amplifier 22.

With this configuration, the coupling between the inductors included in the low-noise amplifiers 21 and 22 can be suppressed by using the first via conductor and the electric characteristics (e.g., amplification characteristics) of the low-noise amplifiers 21 and 22 can be improved.

In the semiconductor IC 130 according to the present embodiment, for example, the first inductor may be the inductor 218 (choke inductor) in the low-noise amplifier 21 and the second inductor may be the inductor 215 (source inductor) in the low-noise amplifier 22.

With this configuration, the coupling between the choke inductor in the low-noise amplifier 21 and the source inductor in the low-noise amplifier 22 can be suppressed by using the first via conductor and the electric characteristics of the low-noise amplifiers 21 and 22 can be improved.

For example, the semiconductor IC 130 according to the present embodiment may further include a third radio-frequency element (e.g., the inductor 654 in the filter 65) and a second via conductor (e.g., the via conductor 132) that is placed between the second radio-frequency element and the third radio-frequency element and that is connected to a ground potential.

With this configuration, the second via conductor connected to the ground potential can be placed between the second radio-frequency element and the third radio-frequency element. Accordingly, in the semiconductor IC 130, not only the coupling between the first radio-frequency element and the second radio-frequency element but also the coupling between the second radio-frequency element and the third radio-frequency element can be suppressed.

In the semiconductor IC 130 according to the present embodiment, for example, the first radio-frequency element may be a first inductor, the second radio-frequency element may be a second inductor, and the third radio-frequency element may be a third inductor.

With this configuration, the first via conductor can be placed between the first inductor and the second inductor and the second via conductor can be placed between the second inductor and the third inductor. In general, coupling (in particular, inductive coupling) more easily occurs between inductors as compared with between radio-frequency elements other than inductors. Accordingly, the coupling between the first inductor and the second inductor can be effectively suppressed by using the first via conductor, and the coupling between the second inductor and the third inductor can be effectively suppressed by using the second via conductor, For example, the semiconductor IC 130 according to the present embodiment may further include the low-noise amplifiers 21 and 22 and the filter 65. The first inductor may be included in the low-noise amplifier 21, the second inductor may be included in the low-noise amplifier 22, and the third inductor may be included in the filter 65.

With this configuration, the coupling between the inductors included in the low-noise amplifiers 21 and 22 can be suppressed by using the first via conductor and the coupling between the inductors included in the low-noise amplifier 22 and the filter 65 can be suppressed by using the second via conductor. Accordingly, the electric characteristics of the low-noise amplifiers 21 and 22 and the filter 65 can be improved.

The radio-frequency module 1 according to the present embodiment includes the semiconductor IC 130 and the module substrate 91 on which the semiconductor IC 130 is placed.

With this configuration, the radio-frequency module 1 can be formed by using the semiconductor IC 130 capable of suppressing the coupling between radio-frequency elements and the electric characteristics of the radio-frequency module 1 can be improved.

In the radio-frequency module 1 according to the present embodiment, for example, the module substrate 91 may have the main surfaces 91a and 91b facing each other, the semiconductor IC 130 may be placed on the main surface 91b, and the radio-frequency module 1 may further include at least one surface-mount component (e.g., the switch 54 and the filters 61 to 64) placed on the main surface 91a and the multiple post electrodes 150 placed on the main surface 91b.

With this configuration, components can be placed on both surfaces of the module substrate 91 and the radio-frequency module 1 can be miniaturized.

In the radio-frequency module 1 according to the present embodiment, for example, the at least one surface-mount component (e.g., the filter 61) may be connected to the first via conductor (e.g., the via conductor 131) and overlap the first via conductor in plan view.

With this configuration, the surface-mount component can be connected to the ground via the first via conductor in the semiconductor IC 130 and can be placed to overlap the first via conductor in plan view. Accordingly, the ground wiring line of the surface-mount component can be shortened, and the deterioration of electric characteristics due to a parasitic inductance can be suppressed.

In the radio-frequency module 1 according to the present embodiment, for example, the at least one surface-mount component may include an acoustic wave filter (e.g., the filters 61 to 64).

With this configuration, the acoustic wave filter can be connected to the ground via the first via conductor in the semiconductor IC 130 and can be placed to overlap the first via conductor in plan view. Accordingly, the ground wiring line of the acoustic wave filter can be shortened, and the deterioration of electric characteristics due to a parasitic inductance can be suppressed.

In the radio-frequency module 1 according to the present embodiment, for example, the at least one surface-mount component may include the filter 61 having a passband including at least a part of the communication band A, the filter 62 having a passband including at least a part of the communication band B, the filter 63 having a passband including at least a part of the communication band C, and the filter 64 having a passband including at least a part of the communication band D. The semiconductor IC 130 may include the filter 65 having a passband including the at least a part of the communication band A, the at least a part of the communication band B, the at least a part of the communication band C, and the at least a part of the communication band D, the low-noise amplifier 21 that includes the inductor 218 as the first radio-frequency element, the low-noise amplifier 22 that includes the inductor 215 as the second radio-frequency element, the switch 51 connected between the low-noise amplifier 21 and each of the filters 61 and 62, the switch 52 connected between the low-noise amplifier 22 and each of the filters 63 and 64, the switch 53 connected between the filter 65 and each of the low-noise amplifiers 21 and 22, and the control circuit 70 configured to control at least one of the switch 51, the switch 52, the switch 53, the low-noise amplifier 21, or the low-noise amplifier 22.

With this configuration, the semiconductor IC 130 can be used for the radio-frequency module 1 that supports a plurality of communication bands.

In the radio-frequency module 1 according to the present embodiment, for example, the semiconductor IC 130 may include the multiple via conductors 131 including the first via conductor and the multiple via conductors 131 may be placed between the low-noise amplifiers 21 and 22.

With this configuration, the multiple via conductors 131 can be placed between the low-noise amplifiers 21 and 22 and the coupling between the inductors 218 and 215 included in the low-noise amplifiers 21 and 22 can be suppressed. Accordingly, the isolation between the low-noise amplifiers 21 and 22 can be improved, and the electric characteristics of the low-noise amplifiers 21 and 22 can be improved.

In the radio-frequency module 1 according to the present embodiment, for example, the filter 65 may include the inductor 654 and the semiconductor IC 130 may include the multiple via conductors 132 placed between the low-noise amplifier 22 and the filter 65.

With this configuration, the multiple via conductors 132 can be placed between the low-noise amplifier 22 and the filter 65 and the coupling between the inductor 215 included in the low-noise amplifier 22 and the inductor 654 included in the filter 65 can be suppressed. Accordingly, the isolation between the low-noise amplifier 22 and the filter 65 can be improved, and the electric characteristics of the low-noise amplifier 22 and the filter 65 can be improved.

In the radio-frequency module 1 according to the present embodiment, for example, the semiconductor IC 130 may include the multiple via conductors 133 placed between the control circuit 70 and at least one of the filter 65, the switch 51, the switch 52, the switch 53, the low-noise amplifier 21, or the low-noise amplifier 22.

With this configuration, the multiple via conductors 133 can be placed between the control circuit 70 and the radio-frequency circuit. Accordingly, the isolation between the control circuit 70 and the radio-frequency circuit can be improved, and the electric characteristics of the control circuit 70 and the radio-frequency circuit can be improved.

In the radio-frequency module 1 according to the present embodiment, for example, at least one of the filter 61, 62, 63, or 64 may be connected to at least one of the multiple via conductors 131 and overlap the at least one of the multiple via conductors 131 in plan view.

With this configuration, at least one of the filter 61, 62, 63, or 64 can be connected to the ground via the via conductor 131 in the semiconductor IC 130. The filters 61 to 64 can be placed such that at least one of the filter 61, 62, 63, or 64 overlaps the via conductor 131 in plan view. Accordingly, the ground wiring line of at least one of the filter 61, 62, 63, or 64 can be shortened, and the deterioration of electric characteristics due to a parasitic inductance can be suppressed.

In the radio-frequency module 1 according to the present embodiment, for example, at least one of the filter 61, 62, 63, or 64 may be connected to at least one of the multiple via conductors 132 and overlap the at least one of the multiple via conductors 132 in plan view.

With this configuration, at least one of the filter 61, 62, 63, or 64 can be connected to the ground via the via conductor 132 in the semiconductor IC 130. The filters 61 to 64 can be placed such that at least one of the filter 61, 62, 63, or 64 overlaps the via conductor 132 in plan view. Accordingly, the ground wiring line of at least one of the filter 61, 62, 63, or 64 can be shortened, and the deterioration of electric characteristics due to a parasitic inductance can be suppressed.

In the radio-frequency module 1 according to the present embodiment, for example, at least one of the filter 61, 62, 63, or 64 may be connected to at least one of the multiple via conductors 133 and overlap the at least one of the multiple via conductors 133 in plan view.

With this configuration, at least one of the filter 61, 62, 63, or 64 can be connected to the ground via the via conductor 133 in the semiconductor IC 130. The filters 61 to 64 can be placed such that at least one of the filter 61, 62, 63, or 64 overlaps the via conductor 133 in plan view. Accordingly, the ground wiring line of at least one of the filter 61, 62, 63, or 64 can be shortened, and the deterioration of electric characteristics due to a parasitic inductance can be suppressed.

The semiconductor IC 130 according to the present embodiment includes a radio-frequency circuit (e.g., the low-noise amplifiers 21 and 22, the switches 51 to 53, and the filter 65), the control circuit 70, and the via conductor 133 that is placed between the radio-frequency circuit and the control circuit 70 and that is connected to a ground potential.

With this configuration, the via conductor 133 connected to the ground potential can be placed between the radio-frequency circuit and the control circuit 70. Accordingly, the inductive coupling and/or capacitive coupling between the radio-frequency circuit and the control circuit can be suppressed in the semiconductor IC 130. As a result, the electric characteristics of the radio-frequency circuit can be improved.

Other Embodiments

A semiconductor integrated circuit and a radio-frequency module according to the present disclosure have been described using the embodiment, but the semiconductor integrated circuit and the radio-frequency module according to the present disclosure are not limited to the above-described embodiment. The present disclosure also includes other embodiments realized by combining optional constituent elements in the above-described embodiment, modifications obtained by making various changes, which are conceived by those skilled in the art, to the above-described embodiment without necessarily departing from the spirit and scope of the present disclosure, and various apparatuses including the above-described radio-frequency module and the above-described communication device.

For example, in the circuit configurations of a radio-frequency module and a communication device according to the above-described embodiment, another circuit element, a wiring line, and so forth may be provided in a path that connects each circuit element and a signal path disclosed in the drawings. For example, an impedance matching circuit may be provided between the switch 54 and each of the filters 61 to 64. An impedance matching circuit may be provided, for example, between the switch 51 and the low-noise amplifier 21 and/or between the switch 52 and the low-noise amplifier 22. An impedance matching circuit may be formed of, for example, an inductor and/or a capacitor.

Although the radio-frequency module 1 is a reception circuit for receiving a radio-frequency signal in the above-described embodiment, the radio-frequency module 1 is not limited thereto. For example, the radio-frequency module 1 may be a transmission circuit for transmitting a radio-frequency signal or a transmission/reception circuit for transmitting and receiving radio-frequency signals.

Although each of the multiple via conductors 131 to 133 formed in the semiconductor IC 130 has a circular cylindrical shape in the above-described embodiment, the shape of each of the multiple via conductors 131 to 133 is not limited thereto. Each of the multiple via conductors 131 to 133 may have, for example, a rectangular cylindrical shape. The multiple via conductors 131 may be placed such that the adjacent ones of the via conductors 131 are in contact with each other. The multiple via conductors 131 may be coupled to form a single wall. The same thing can be said for the multiple via conductors 132 and the multiple via conductors 133.

Although the multiple post electrodes 150 are used as a plurality of external connection terminals in the above-described embodiment, the multiple external connection terminals are not limited thereto. For example, a plurality of bump electrodes may be used instead of the multiple post electrodes 150. In this case, the main surface 91b of the module substrate 91 does not necessarily have to be covered with the resin member 93.

INDUSTRIAL APPLICABILITY

The present disclosure is widely applicable for use in a communication device (e.g., a mobile phone) as a semiconductor IC and a radio-frequency module placed in the front-end portion.

REFERENCE SIGNS LIST 1 radio-frequency module
2 antenna
3 RFIC
4 BBIC
5 communication device
21 and 22 low-noise amplifier
51, 52, 53, and 54 switch
61, 62, 63, 64, and 65 filter
70 control circuit
91 module substrate
91a and 91b main surface
92 and 93 resin member
95 shield electrode layer
100 antenna connection terminal 120 radio-frequency output terminal
130 semiconductor integrated circuit (IC)
131, 132, 133, 911, 912, and 913 via conductor
150 post electrode
211 and 651 input terminal
212 and 652 output terminal
213 and 214 field effect transistor (FET)
215, 218, 653, and 654 inductor
216, 217, 219, 210, 655, 656, and 657 capacitor
511, 512, 513, 521, 522, 523, 531, 532, 533, 541, 542, 543, 544, and 545 terminal
914 ground electrode pattern

The invention claimed is:

1. A semiconductor integrated circuit comprising:
a first radio-frequency circuit element;
a second radio-frequency circuit element;
a first low-noise amplifier;
a second low-noise amplifier; and
a first via conductor between the first radio-frequency circuit element and the second radio-frequency circuit element and that is connected to a ground potential,
wherein the first radio-frequency circuit element comprises a first inductor,
wherein the second radio-frequency circuit element comprises a second inductor,
wherein the first low-noise amplifier comprises the first inductor,
wherein the second low-noise amplifier comprises the second inductor,
wherein the first inductor comprises a choke inductor, and
wherein the second inductor comprises a source inductor.

2. The semiconductor integrated circuit according to claim 1, wherein the first via conductor comprises a through via passing through the semiconductor integrated circuit in a thickness direction of the semiconductor integrated circuit.

3. The semiconductor integrated circuit according to claim 1, further comprising:
a third radio-frequency circuit element; and
a second via conductor between the second radio-frequency circuit element and the third radio-frequency circuit element, and that is connected to the ground potential.

4. The semiconductor integrated circuit according to claim 3,
wherein the third radio-frequency circuit element comprises a third inductor.

5. The semiconductor integrated circuit according to claim 4, further comprising:
an LC filter,
wherein the LC filter comprises the third inductor.

6. A radio-frequency module comprising:
the semiconductor integrated circuit according to claim 1; and
a module substrate carrying the semiconductor integrated circuit.

7. The radio-frequency module according to claim 6,
wherein the module substrate comprises a first main surface and a second main surface, the first main surface and the second main surface facing each other,
wherein the semiconductor integrated circuit is on the second main surface, and
wherein the radio-frequency module further comprises:
at least one component on the first main surface; and
a plurality of external connection terminals on the second main surface.

8. The radio-frequency module according to claim 7, wherein the at least one component is connected to the first via conductor and overlaps the first via conductor in plan view.

9. The radio-frequency module according to claim 8, wherein the at least one component comprises an acoustic wave filter.

10. The radio-frequency module according to claim 7, wherein the at least one component includes:

a first filter comprising a passband including at least a part of a first communication band, a second filter comprising a passband including at least a part of a second communication band, a third filter comprising a passband including at least a part of a third communication band, and a fourth filter comprising a passband including at least a part of a fourth communication band, and wherein the semiconductor integrated circuit includes:

a fifth filter comprising a passband including the at least a part of the first communication band, the at least a part of the second communication band, the at least a part of the third communication band, and the at least a part of the fourth communication band, a first switch connected between the first low-noise amplifier and each of the first filter and the second filter, a second switch connected between the second low-noise amplifier and each of the third filter and the fourth filter, a third switch connected between the fifth filter and each of the first low-noise amplifier and the second low-noise amplifier, and a control circuit configured to control at least one of the first switch, the second switch, the third switch, the first low-noise amplifier, or the second low-noise amplifier.

11. The radio-frequency module according to claim 10, wherein the semiconductor integrated circuit comprises a plurality of first via conductors including the first via conductor, and wherein the plurality of first via conductors are between the first low-noise amplifier and the second low-noise amplifier.

12. The radio-frequency module according to claim 10, wherein the fifth filter comprises a third inductor, and wherein the semiconductor integrated circuit comprises a plurality of second via conductors between the second low-noise amplifier and the fifth filter.

13. The radio-frequency module according to claim 10, wherein the semiconductor integrated circuit comprises a plurality of third via conductors between the control circuit and at least one of the fifth filter, the first switch, the second switch, the third switch, the first low-noise amplifier, or the second low-noise amplifier.

14. The radio-frequency module according to claim 11, wherein at least one of the first filter, the second filter, the third filter, or the fourth filter is connected to at least one of the plurality of first via conductors and overlaps the at least one of the plurality of first via conductors in plan view.

15. The radio-frequency module according to claim 12, wherein at least one of the first filter, the second filter, the third filter, or the fourth filter is connected to at least one of the plurality of second via conductors and overlaps the at least one of the plurality of second via conductors in plan view.

16. The radio-frequency module according to claim 13, wherein at least one of the first filter, the second filter, the third filter, or the fourth filter is connected to at least one of the plurality of third via conductors and overlaps the at least one of the plurality of third via conductors in plan view.

* * * * *